United States Patent [19]

Mensch, Jr.

[11] 3,906,255

[45] Sept. 16, 1975

[54] MOS CURRENT LIMITING OUTPUT CIRCUIT

[75] Inventor: William David Mensch, Jr., Mesa, Ariz.

[73] Assignee: Motorola, Inc., Chicago, Ill.

[22] Filed: Sept. 6, 1974

[21] Appl. No.: 503,576

[52] U.S. Cl. ................ 307/205; 307/209; 307/215; 307/218; 307/237; 307/303; 307/270; 357/59; 357/51; H01L/29/04

[51] Int. Cl.² ................. H03K 19/08; H03K 19/22; H03K 19/36; H01L 29/04; H01L 29/04 H01L 29/04

[58] Field of Search ........... 307/205, 214, 215, 213, 307/218, 209, 270, 304, 303, 237; 330/35; 357/59, 51

[56] References Cited

UNITED STATES PATENTS

| | | | |
|---|---|---|---|
| 3,479,523 | 11/1969 | Pleshko | 307/205 |
| 3,576,478 | 4/1971 | Watkins | 357/59 X |
| 3,581,226 | 5/1971 | Perkins et al. | 330/35 X |
| 3,603,811 | 9/1971 | Day et al. | 307/304 X |
| 3,605,728 | 9/1971 | Ogle | 307/304 X |
| 3,641,370 | 2/1972 | Heimbigner | 307/205 X |
| 3,660,684 | 5/1972 | Padgett et al. | 307/251 X |
| 3,749,936 | 7/1973 | Bell | 307/205 X |
| 3,806,738 | 4/1974 | Chin et al. | 307/304 X |
| 3,839,646 | 10/1974 | Soloway | 307/304 X |

OTHER PUBLICATIONS

Lee et al., "Low-Power Dissipation FET Driver Circuit"; IBM Tech. Discl. Bull.; Vol. 14, No. 4, p. 1084; 9/1971.

*Primary Examiner*—Andrew J. James
*Assistant Examiner*—L. N. Anagnos
*Attorney, Agent, or Firm*—Vincent I. Rauner; Charles R. Hoffman

[57] ABSTRACT

An MOS push-pull driver circuit includes a pull up MOSFET and a pull-down MOSFET coupled to an output node. A polycrystalline silicon current limiting resistor is connected between the drain of the pull-up MOSFET and the supply voltage conductor to provide a closer tolerance output current than is normally feasible for state-of-the-art MOSFET manufacturing processes.

3 Claims, 7 Drawing Figures

MOS CURRENT LIMITING OUTPUT CIRCUIT

BACKGROUND OF THE INVENTION

MOS push-pull driver circuits are well known in the art. They usually include a pull-up MOSFET (metal oxide semiconductor field effect transistor) having its drain connected to a "high" voltage conductor and a source connected to an output node and further include a pull-down MOSFET having its drain connected to the output node and its source connected to a ground supply conductor. The gate electrodes of the pull-up and pull-down MOSFETs are generally coupled, respectively, to MOS inverters or logic gates and supply approximately complementary signals to prevent the pull-up and pull-down MOSFET's from being switched into the conducting state at the same time. The current through a pull-up MOSFET when it is in the "on" state, supplied to an external circuit, such as a Darlington input circuit is a function of MOS processing parameters such as substrate doping, gate oxide thickness, surface mobility of the semiconductor chip, and other parameters, including temperature. The present state of the MOS manufacturing art is such that there may be a large variation in current supplied by a MOSFET over the usual temperature range for which such devices must perform. Certain external circuits such as Darlington input circuits, which are driven by such a MOSFET pull-up device may not be able to withstand the normal range of current supplied by the pull-up MOSFET without causing damage to the external circuit.

SUMMARY OF THE INVENTION

It is an object of this invention to provide a MOSFET push-pull buffer capable of providing a relatively well regulated output current.

It is another object of the invention to provide an MOS output circuit utilizing an integrated circuit resistor connected in series with a pull-up MOSFET of the push-pull buffer to provide a well regulated output current.

Briefly described, the invention is a MOSFET output device with a integrated circuit resistor connected in series with a main electrode of the MOSFET to provide a well regulated current through the MOSFET.

DESCRIPTION OF THE INVENTION

Figure 1:
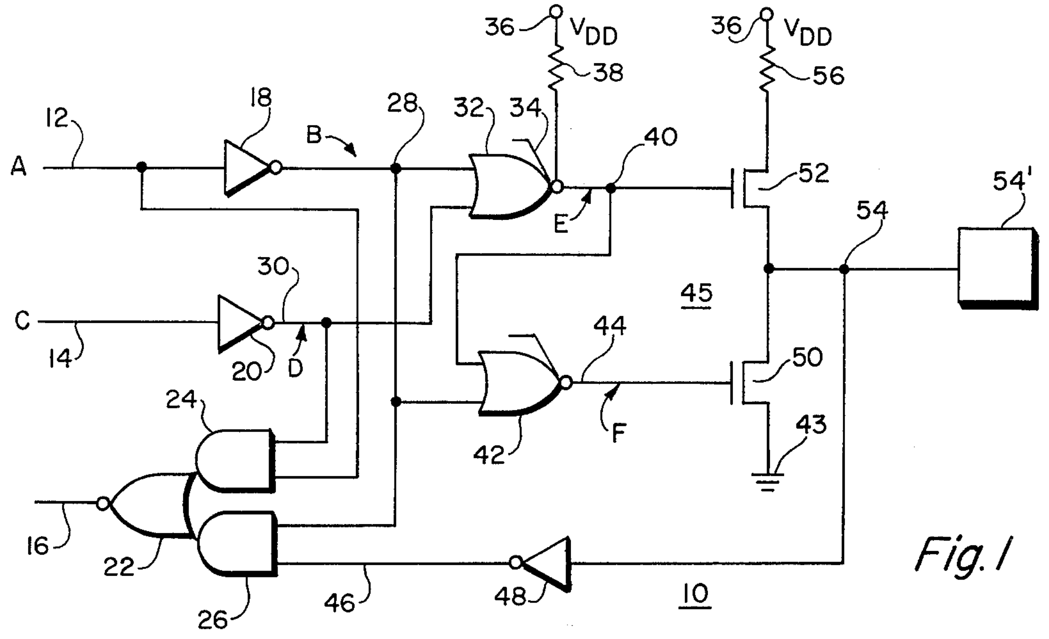
FIG. 1 is a logic diagram of a preferred embodiment of the invention.

The logic diagram in FIG. 1 is a preferred embodiment of the invention. Circuit 10 is a buffer circuit which may be used in the microsystem controller chip of patent application Ser. No. 519,138 entitled LOGIC STRUCTURE FOR A MULTI-PURPOSE PERIPHERAL INTERFACE ADAPTOR CIRCUIT FOR DATA PROCESSING SYSTEM assigned to the assignee of the present invention. Circuit 10 includes inputs 12, 14, and 16 and output 54. Inverter 18 has an input connected to node 12 and an output connected to node 28. Inverter 20 has an input connected to node 14 and output connected to node 30. Two-input NOR gate 32 has one input connected to node 28 and the other input connected to node 30 and has an output connected to node 40. NOR gate 32 is a conventional bootstrap NOR gate. The symbol representing the bootstrap NOR gate differs from the symbol for a logic symbol for a conventional NOR gate by the addition of line 34. The resistor 38 is coupled between node 40 and power supply conductor 36. Two-input bootstrap NOR gate 42 has one input connected to node 40 and its other input connected to node 28 and has its output connected to node 44. Push-pull buffer circuit 45 includes pull-up MOSFET 52 having its gate connected to node 40 and its source connected to output 54. Pull-down MOSFET 50 of push-pull buffer 45 has its source connected to ground conductor 43 and its gate connected to node 44 and its drain connected to node 54. Circuit 10 further includes inverter 48 having an input connected to the node 54 and an output connected to node 46. Two-input AND gate 24 has an input connected to node 30 and another input connected to node 12. Two-input AND gate 26 has one input connected to node 46 and its other input connected to node 28. Two-input NOR gate 22 has its output connected to node 16 and one input connected to the output of AND gate 24 and the other input connected to the output of AND gate 26.

Figure 3A:
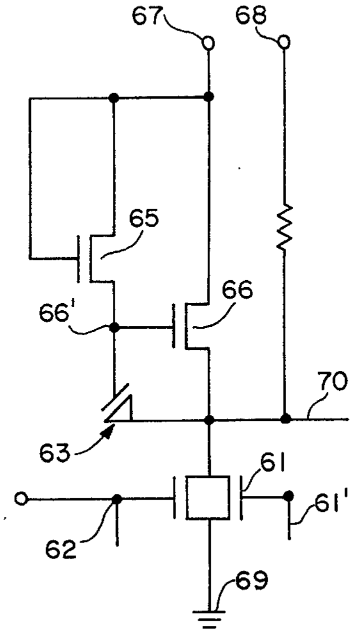
FIG. 3A is a circuit diagram of a MOS implementation of the bootstrap NOR gate of FIG. 1.
Figure 3B:
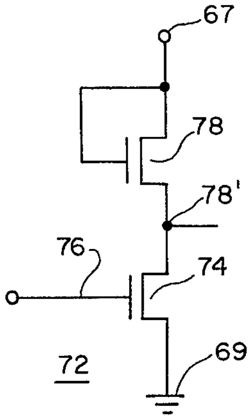
FIG. 3B is an MOS implementation of the inverters of FIG. 1.
Figure 3C:
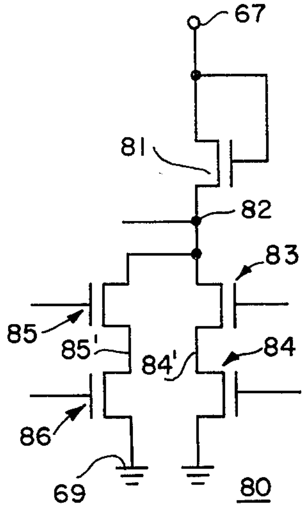
FIG. 3C is an MOS implementation of the AND/-NOR gates of FIG. 1.

FIGS. 3*a*, 3*b*, and 3*c* are schematic diagrams of the combinational NAND/NOR gate, the inverters, and the two input NOR gates of FIG. 1. FIG. 3a includes bootstrap NOR gate 60, which includes input MOSFET's 61 and 62 coupled between output nodes 70 and ground conductor 69. The gate electrode 61' of MOSFET 61 is one input and gate electrode 62' of MOSFET 62 is the other input of NOR section of the combinational gate. Load MOSFET 66 is coupled between $V_{DD}$ conductor 67 and output node 70 and has its gate connected to the source of diode-connected MOSFET 65 having its gate and drain connected to node 67 and its source connected to node 66' which is also connected to the gate of MOSFET 66. Bootstrap capacitor 63 is connected between node 66' and node 70.

FIG. 3b is a typical MOSFET inverter which may be used for inverters 18, 20, and 48 in FIG. 1. Inverter 72 includes MOSFET 74 connected between ground conductor 69 and output node 78' and has its gate connected to input node 76. Load MOSFET 78 has it gate and drain connected to node 67 and its source connected to the node 78'.

FIG. 3c is the combinational gate including AND gates 24 and 26 and NOR gate 22 in FIG. 1. Combinational gate 80 includes load MOSFET 81 having its gate and drain connected to power conductor 67 and its source connected to output node 82. MOSFETs are four terminal devices including a gate electrode a source and a drain electrode, and a bulk, or substrate electrode (often not shown in the circuit symbol for a MOSFET). The source and the drain are interchangeable, since the MOSFET is a bi-lateral device, and may be referred to herein as main electrodes. MOSFET 83 has its drain connected to node 82, its gate connected to an input node and its source connected to node 84'. MOSFET 84 has its drain connected to node 84' and its source connected to ground conductor 69 and has its gate electrode connected to another input. MOSFETs 83 and 84 perform the ANDing function of a single AND gate. MOSFETs 85 and 86 provide the other required AND function. MOSFET 85 has its drain connected to node 82 and its source connected to node 85' ant its gate electrode connected to a third input. MOSFET 86 has its drain connected to node 85', its gate connected to a fourth input, and its source connected to ground conductor 69.

Figure 2:
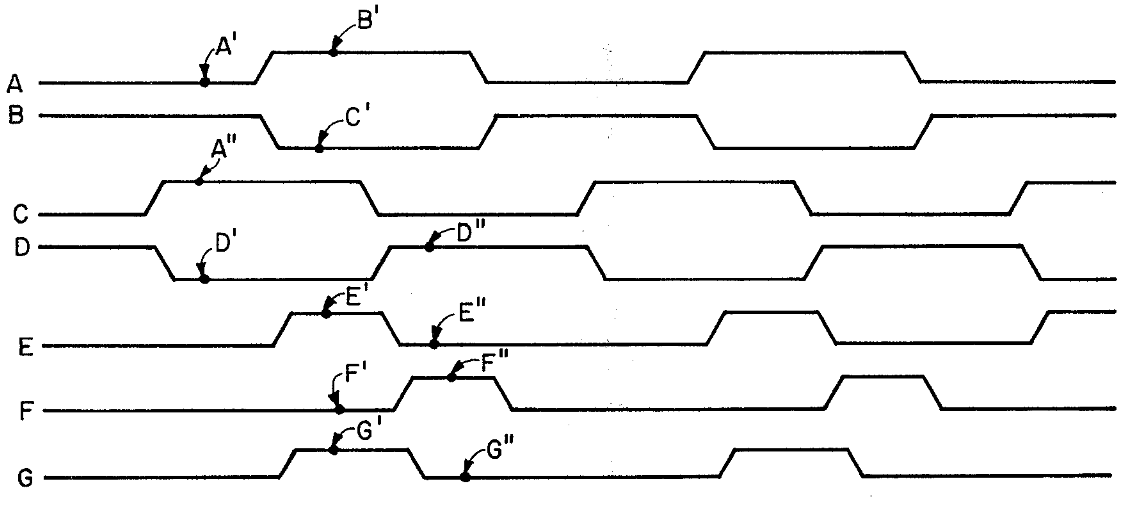
FIG. 2 is a timing diagram useful in describing the operation of the embodiment of FIG. 1.

The operation of the circuit of FIGS. 1 and 3 is now described with relation to the timing diagram of FIG. 2.

Waveform A, applied to node 12 and waveform C, applied to node 14 are inputs to circuit 10. Inverter 18 produces as its output waveform B and inverter 20 produces output waveform D. If the voltage level of waveform B is at a logical "1", the voltage at node 40, represented by waveform E, is clamped to a logical "0" and also the waveform at node 44, waveform F, is at a logical 0, which is ground potential in FIG. 1. Thus output buffer 45 is in the so called three-state mode, since both pull-up MOSFET 52 and pull-down MOSFET 50 are off. Then the voltage at node 54 and at bonding pad 54' (for an integrated embodiment of circuit 10) is electrically floating or is at a voltage determined by external circuitry (not shown) connected to bonding pad 54' or node 54. Such a voltage will be sensed by inverter 48 and ANDed with waveform B to produce a signal at node 16.

Referring to FIG. 2, it is seen that when waveform A is at a logical 0 at point A' node B is at a logical 1. At the same time input C at point A'' is at a logical 1 and therefore, waveform D is at a logical 0. Since waveform B is at a logical 1, nodes E and F must be at a logical 0 and output buffer 45 is in the three-state mode, as indicated by waveform G, which appears at node 54. When waveform A goes from a logical 0 to a logical 1, for example, at point B' waveform B goes to a logical 0 (point C'). Then NOR gates 32 and 42 are enabled, so that the logical 0 on waveform D on line segment B' is now inverted by NOR gate 32 to produce a logical 1 at node E, indicated by reference letter E'. This voltage is fed back through NOR gate 42, resulting in waveform F at node 44 being held at zero volts, as at point F'. Thus, a logical 1 is maintained at E' and at G' on waveform E and G, respectively, until waveform D undergoes the transition from level D' to D'' at which point NOR gate 32 clamps waveform E back to a logical 0, as at point E'', turning MOSFET 52 off. Since waveform E is still at a logical 0, this causes NOR gate 42 to generate a logical 1 at node 44, creating a level indicated on waveform F by the letter F''. This results in turning on MOSFET 50 which discharges the output node to ground, at the level indicated G'' on waveform G.

Figure 4A:
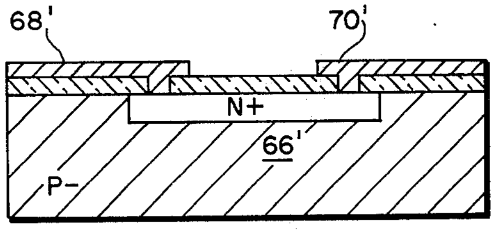
FIG. 4A is a cross-sectional view of a diffused resistor which may be utilized in the embodiment of FIG. 1.

FIG. 4*a* shows the cross sectional view of a diffused current limiting resistor which for certain MOS manufacturing methods would be suitable as a current limiting resistor. The main factors that determine the suitability of the diffused resistor as a current loading resistor are the magnitude of the desired current, the amount of chip area which may be allocated to the diffused resistor, and the value and tolerance of the sheet resistance of the diffused region.

Figure 4B:
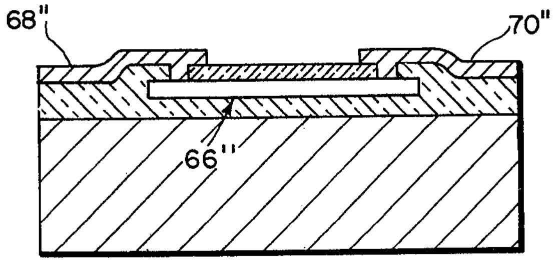
FIG. 4B is a cross-sectional diagram of a polycrystalline resitor which may be utilized to implement the resistor of the embodiment of FIG. 1.

FIG. 4b is a cross sectional diagram of a polycrystalline silicon resistor. This type of resistor would be utilizable as a current limiting resistor according to the invention for silicon gate MOS manufacturing process. The polycrystalline silicon resistor has one terminal connected to power supply conductor and its other end preohmically contacting the drain of pull-up MOSFET.

Those skilled in the art will recognize that use of current limiting resistors in integrated circuits is well known in bi-polar integrated circuit technologies. Diffused resistors have been used in bipolar integrated circuit technologies in emitter follower type circuits that limit current and in series with the collector of bipolar transistors to determine the saturation current through a bipolar transistor. However, current limiting resistors have not previously been used in series with the drawing of MOSFET and integrated circuit technology because MOSFET devices themselves are essentially resistive and are essentially current limiting devices and further have the opposite temperature coefficient of bipolar transistors, so that thermal runaway is not a problem in the MOSFET technology. While current limiting resistors in the collector circuit of bipolar IC's have been used to prevent thermal runaway, according to the present invention the current limiting resistor is not to prevent thermal runaway of any type but rather is to provide a more precisely limited current (determined primarily by the sheet resistance to the difussed region or of the polycrystalline silicon) than is possible with the MOSFET device due to variations in silicon surface mobility and variations in MOSFET threshold voltage.

While the invention has been described with reference to several embodiments thereof, those skilled in the art will recognize that the changes in form and placement of parts may be made to suit varying requirements within the scope of the invention.

What is claimed is:

1. An MOS circuit comprising:

a pull-up MOSFET connected between a first node and an output node and having its gate connected to a second node;

a current limiting resistor connected between said first node and a third node for limiting the current in said pull-up MOSFET;

a pull-down MOSFET connected between said output node and a fourth node and having its gate connected to a fifth node;

a first NOR gate having an output connected to said second node and having one input connected to a sixth node and another input connected to a seventh node;

a second NOR gate having an output connected to said fifth node and an input connected to said second node and another input connected to said sixth node;

a first inverter having an output connected to said sixth node and an input connected to an eighth node connected to a first input of said MOS circuit;

a second inverter having an output connected to said seventh node and an input connected to a ninth node connected to a second input of said MOS circuit;

a third inverter having an input connected to said output node and an output connected to a tenth node;

a combinational AND/NOR gate having first and second twoinput AND sections, said combinational AND/NOR gate having an output connected to an eleventh node, said first two-input AND section having an input connected to said seventh node and another input connected to an eighth node, said second two-input AND section having an input connected to said sixth node and another input connected to said tenth node.

2. The MOS circuit as recited in claim 1 further including a pull-up resistor connected between said third node and said second node.

3. The MOS circuit as recited in claim 2 wherein said first and second NOR gates are bootstrap NOR gates.

* * * * *